(12) United States Patent  
Zhang et al.

(10) Patent No.: US 11,888,022 B2  
(45) Date of Patent: Jan. 30, 2024

(54) SOI LATERAL HOMOGENIZATION FIELD HIGH VOLTAGE POWER SEMICONDUCTOR DEVICE, MANUFACTURING METHOD AND APPLICATION THEREOF

(71) Applicant: University of Electronic Science and Technology of China, Chengdu (CN)

(72) Inventors: Wentong Zhang, Chengdu (CN); Ning Tang, Chengdu (CN); Ke Zhang, Chengdu (CN); Nailong He, Chengdu (CN); Ming Qiao, Chengdu (CN); Zhaoji Li, Chengdu (CN); Bo Zhang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 32 days.

(21) Appl. No.: 17/744,779

(22) Filed: May 16, 2022

(65) Prior Publication Data

US 2023/0053369 A1    Feb. 23, 2023

(30) Foreign Application Priority Data

Aug. 19, 2021    (CN) .......................... 202110952823.4

(51) Int. Cl.
*H01L 29/06* (2006.01)
*H01L 29/40* (2006.01)
(Continued)

(52) U.S. Cl.
CPC ........ *H01L 29/0607* (2013.01); *H01L 29/407* (2013.01); *H01L 29/66325* (2013.01);
(Continued)

(58) Field of Classification Search
CPC .............. H01L 29/0607; H01L 29/407; H01L 29/66325; H01L 29/66681; H01L 29/7394; H01L 29/7823; H01L 29/7824; H01L 29/78624; H01L 29/78696; H01L 29/0692; H01L 29/0878; H01L 29/42368; H01L 29/404; Y02B 70/10
See application file for complete search history.

(56) References Cited

U.S. PATENT DOCUMENTS

2022/0367388 A1*  11/2022  Sadovnikov .......... H01L 29/401

* cited by examiner

*Primary Examiner* — Mohammed R Alam
(74) *Attorney, Agent, or Firm* — Bayramoglu Law Offices LLC (57) ABSTRACT

An SOI lateral homogenization field high voltage power semiconductor device, and a manufacturing method and application thereof are provided. The device includes a type I conductive semiconductor substrate, a type II conductive drift region, a type I field clamped layer, type I and type II conductive well regions, the first dielectric oxide layer forming a field oxide layer, the second dielectric oxide layer forming a gate oxide layer, a type II conductive buried dielectric layer, a type II conductive source heavily doped region, a type II conductive drain heavily doped region. The first dielectric oxide layer and the floating field plate polysilicon electrodes form a vertical floating field plate distributed throughout the type II conductive drift region to form a vertical floating equipotential field plate array. When the device is in on-state, high doping concentration can be realized by the full-region depletion effect form the vertical field plate arrays.

17 Claims, 8 Drawing Sheets

(51) Int. Cl.
*H01L 29/66* (2006.01)
*H01L 29/739* (2006.01)
*H01L 29/78* (2006.01)

(52) U.S. Cl.
CPC .... *H01L 29/66681* (2013.01); *H01L 29/7394* (2013.01); *H01L 29/7823* (2013.01); *H01L 29/7824* (2013.01)

electrode being inserted in to the buried oxide layer

FIG. 10(a)

electrode not being inserted in to the buried oxide layer

FIG. 10(b)

electrode being inserted in to the buried oxide layer

FIG. 11(a)

electrode not being inserted in to the buried oxide layer

FIG. 11(b)

SOI LATERAL HOMOGENIZATION FIELD HIGH VOLTAGE POWER SEMICONDUCTOR DEVICE, MANUFACTURING METHOD AND APPLICATION THEREOF

CROSS REFERENCE TO THE RELATED APPLICATIONS

This application is based upon and claims priority to Chinese Patent Application No. 202110952823.4, filed on Aug. 19, 2021, the entire contents of which are incorporated herein by reference.

TECHNICAL FIELD

The present invention belongs to the field of power semiconductors, and mainly provides a silicon-on-insulator (SOI) lateral homogenization field high voltage power semiconductor device, and a manufacturing method and application thereof.

BACKGROUND

Power semiconductor devices have been widely used in computers and peripherals, consumer electronics, network communication, electronic special equipment and automotive electronics, instruments and meters, LED display screens and electronic lighting because of their high input impedance, fast switching speed, low loss and wide safe operating area. Lateral devices are widely used in power integrated circuits because their source, gate and drain are all on the same surface, and they are easy to integrate with other devices and circuits through internal connections. SOI materials are widely used because of their low leakage current, no parasitic PN junction capacitance from isolation well, strong anti-latch-up and good radiation resistance. They are widely used in the fields of high speed, low power consumption, radiation resistance and high-temperature resistance, and are known as "silicon integration technology in the 21st century".

SUMMARY

In view of the above problems, the present invention proposes an SOI lateral homogenization field high voltage power semiconductor device, and a manufacturing method thereof, which improves a voltage withstanding characteristic of the device by introducing a global MIS depletion mechanism in the off-state of the device. At the same time, when the device is in the on-state, the highly doped drift region can provide more carriers, which reduces the specific on-resistance and increases the saturation current. This structure improves the current density of the device, eliminates the influence of snapback phenomenon on the output characteristics of the device, and improves the stability of the device.

In order to realize the present invention, the technical solution of the present invention is as follows:

An SOI lateral homogenization field high voltage power semiconductor device, which includes:

A type I conductive semiconductor substrate 11, a type I conductive well region 12, a type I conductive source heavily doped region 13, a type II conductive drift region 21, a type II conductive well region 22, a type II conductive source heavily doped region 23, a type II conductive drain heavily doped region 24, a first dielectric oxide layer 31, second dielectric oxide layer 32, third dielectric oxide layer 33, a buried dielectric layer 34, a polysilicon electrode 41, a control gate polysilicon electrode 42, a source metal 52, and a drain metal 53;

Wherein the buried dielectric layer 34 is located above the type I conductive semiconductor substrate 11, the type II conductive drift region 21 is above the buried dielectric layer 34, the type I conductive well region 12 is located on the left side of the type II conductive drift region 21, the type I conductive source heavily doped region 13 and the type II conductive source heavily doped region 23 are located in the type I conductive well region 12, the type II conductive well region 22 is located on the right side of the type II conductive drift region 21, and the type II conductive drain heavily doped region 24 is located in the type II conductive well region 22; the second dielectric oxide layer 32 is located above the type I conductive well region 12, and the left end of the second dielectric oxide layer 32 is in contact with the type II conductive source heavily doped region 23, and the right end of the second dielectric oxide layer 32 is in contact with the type II conductive drift region 21; the third dielectric oxide layer 33 is located on the upper surface of the type II conductive drift region 21 between the second dielectric oxide layer 32 and the type II conductive drain heavily doped region 24; the control gate polysilicon electrode 42 covers the upper surface of the second dielectric oxide layer 32 and partially extends to the upper surface of the third dielectric oxide layer 33;

The first dielectric oxide layer 31 and the polysilicon electrode 41 constitute vertical floating field plates extending longitudinally, and the number of the vertical floating field plates is one or more; adjacent vertical floating field plates in source-drain directions are staggered; the vertical floating field plates are periodically distributed in the entire region of type II conductive drift region 21, forming a voltage-sustaining layer with a plurality of equipotential floating trenches. The equipotential floating trenches are connected with the buried dielectric layer 34, and the polysilicon electrode 41 is inserted into the buried dielectric layer 34, but does not penetrate the buried dielectric layer 34. The longitudinal spacing and the transverse spacing of the adjacent vertical floating field plates are equal. The transverse direction is the source-drain direction, and the longitudinal direction is perpendicular to the source-drain direction.

Preferably, a cross-sectional shapes of trench regions are rectangular, circular, oval, or hexagonal.

Preferably, a field clamped layer 14, i.e., a Ptop layer, is introduced in the surface of the type II conductive drift region 21.

Preferably, the device is changed to a lateral insulated-gate bipolar transistor (LIGBT) device or a lateral double-diffused metal-oxide semiconductor (PLDMOS) device.

Preferably, a part of the buried dielectric layer below the source is removed; or/and a part of the buried dielectric layer below the drain is removed.

Preferably, the thickness of the buried dielectric layer 34 is determined according to a desired voltage-sustaining level.

Preferably, all of the dielectric oxide layers are formed by thermal growth or by deposition and etching.

The present invention further provides a manufacturing method of the SOI lateral homogenization field high voltage power semiconductor device, which comprises the following steps:

Step 1: selecting a SOI epitaxial wafer;

Step 2: obtaining a type II conductive drift region 21 by implantation and diffusing on the SOI epitaxial wafer;

Step 3: forming a trench by etching through the buried dielectric layer with special mask;

Step 4, forming a first dielectric oxide layer on the trench wall, depositing polysilicon and etching to a silicon plane;

Step 5: forming a type II conductive well region 22 by ion implantation of type II conductive impurities and diffusing;

Step 6, forming a second dielectric oxide layer 32 by thermally oxidizing, and forming a third dielectric oxide layer 33 by depositing and etching;

Step 7, forming a type I conductive well region 12 by ion implantation of type I conductive impurities and diffusing;

Step 8: forming a control gate polysilicon electrode 42 by depositing polysilicon and etching;

Step 9: forming a type I conductive source heavily doped region 13, a type II conductive source heavily doped region 23 and a type II conductive drain heavily doped region 24 by implantation and activation.

Preferably, the manufacturing method further includes: obtaining the type II conductive drift region 21 formed by implantation and diffusing in step 2 by epitaxy; and/or forming the type I conductive well region 12 and the type II conductive well region 22 obtained by implantation and diffusing in step 6 by multiple implantations and activation with different energies.

Preferably, the manufacturing method further comprises: in step 3 of the process, the trench is etched through the buried dielectric layer to reach the substrate, and a assisted depletion is introduced into the substrate by vertical field plates.

Preferably, the manufacturing method further comprises: in step 2, the type II conductive drift region 21 adopts a thermal drive-in process, and the concentration distribution of the type II conductive drift region 21 is a complementary error distribution.

The present invention also provides a manufacturing method of the high voltage lateral homogenization field power semiconductor devices based on SiC, GaN and other wide band gap semiconductors.

The present invention has the advantages as follows. A series of vertical floating field plate arrays formed by the first dielectric oxide 31 and the polysilicon electrode is introduced into the type II conductive drift region 21 of the device. Since the dielectric constant of silicon is almost three times that of the oxide layer, the dielectric layer can obtain larger electric field and higher breakdown voltage under the same drift length. When the device is in the on-state, a much high doping concentration can be insured by the full-region depletion effect from the field plate arrays, thereby reducing the specific on-resistance and improving the saturation current of the device. At the same time, when the electrodes are inserted into the dielectric layer, adaptive charges are introduced by these electrodes inside the dielectric layer, which increases the electric field of the dielectric, realizes enhanced dielectric field (ENDIF) effect and improves the breakdown voltage of the device. Also, due to the existence of the vertical field plate structure, the extraction of inversion charge layer at the interface of buried dielectric layer is suppressed, and the equivalent charges are restricted in the buried dielectric layer, which enhances the electric field of the buried dielectric layer and improves the vertical voltage of the device. Simultaneously, due to the full-region depletion effect of the MIS structure, the concentration of the drift region can still be very high under a relatively thick drift region, which solves the insufficient depletion problem of the SOI device with both N-type and P-type doped drift regions.device. It is a mass-producible ENDIF SOI device.

BRIEF DESCRIPTION OF THE DRAWINGS

FIG. 9(*a*)-FIG. 9(*i*) are process flow diagrams of the device described in Embodiment 1.

FIG. 10(*a*) and FIG. 10(*b*) are comparison diagrams of equipotential lines of devices with or without vertical field plate electrodes inserted into the buried dielectric layer.

FIG. 11(*a*) and FIG. 11(*b*) are comparison diagrams of electric fields under the drain of devices with or without vertical field plate electrodes inserted into the buried dielectric layer.

11 is type I conductive semiconductor substrate, 12 is type I conductive well region, 13 is type I conductive source heavily doped region, 14 is field clamped layer, 21 is type II conductive drift region, 22 is type II conductive well region, 23 is type II conductive source heavily doped region, 24 is type II conductive drain heavily doped region, 31 is first dielectric oxide layer, 32 is second dielectric oxide layer, 33 is third dielectric oxide layer, 34 is buried dielectric layer, 41 is polysilicon electrode, 42 is control gate polysilicon electrode, 51 is surface metal of vertical field plate, 52 is source metal and 53 is drain metal.

DETAILED DESCRIPTION OF THE EMBODIMENTS

Embodiments of the present invention are described below by specific examples, and other advantages and effects of the present invention will be readily apparent to those skilled in the art from the disclosure of the description. The present invention may also be practiced or applied by other detailed descriptions, and the details of this specification may be modified or altered from different viewpoints and applications without departing from the spirit of the present invention.

Figure 10A:
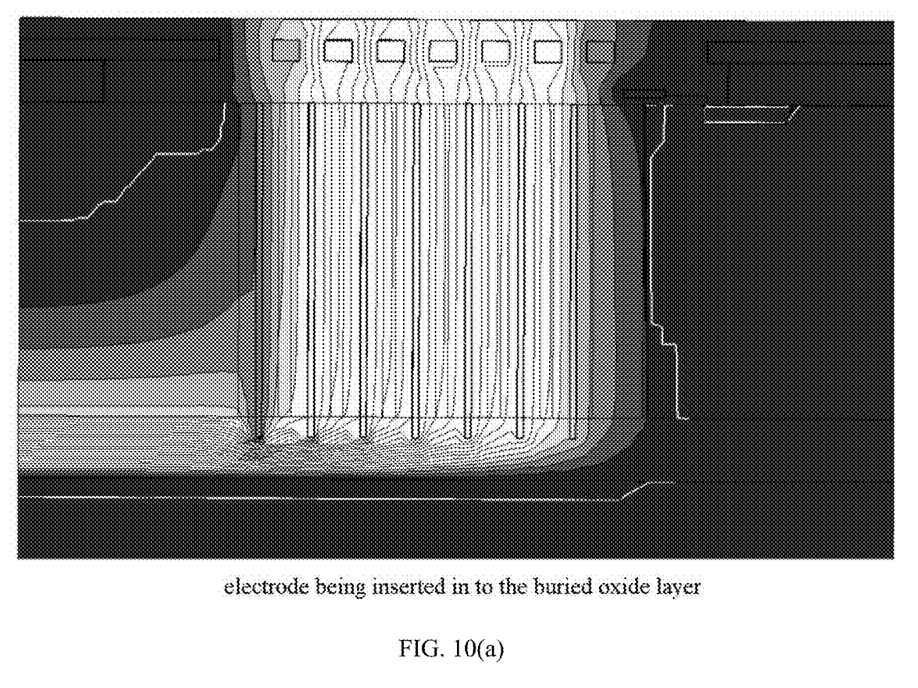
Figure 10B:
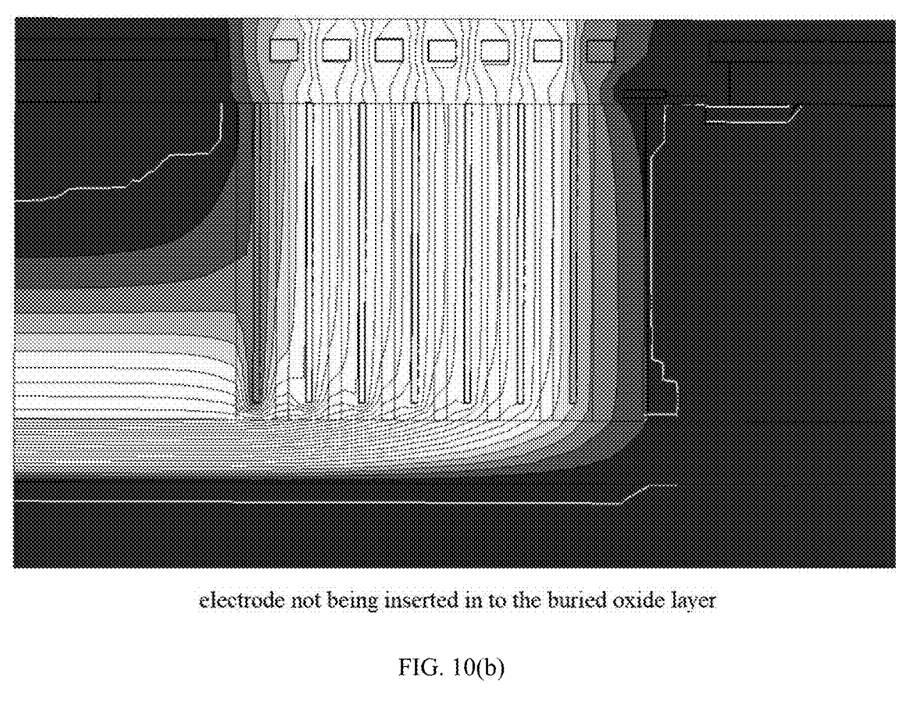
Figure 11A:
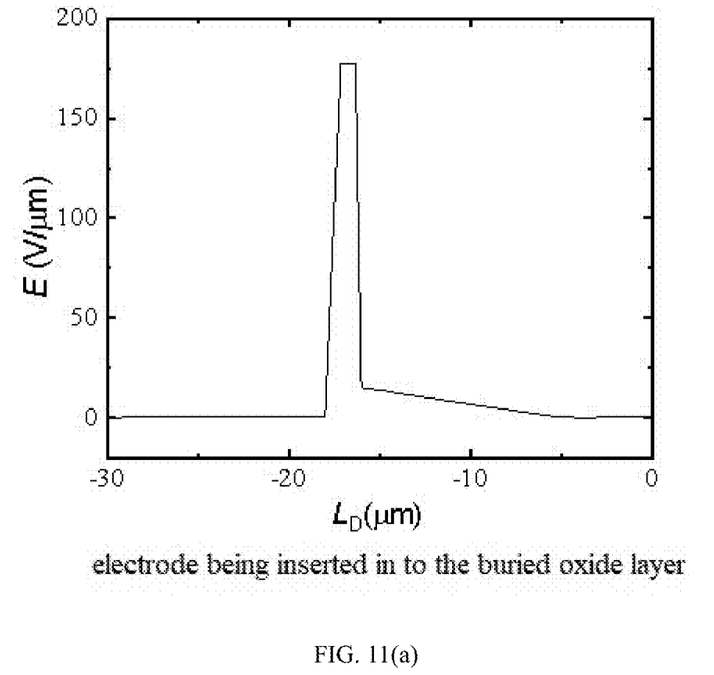
Figure 11B:
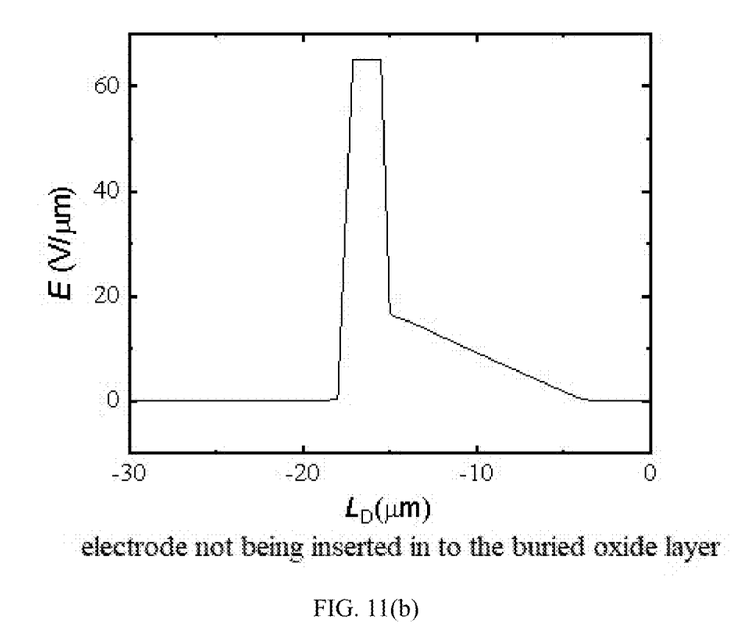

FIGS. 10(a) and 10(b) and FIGS. 11(a) and 11(b) are simulation performance comparisons between devices with or without electrodes inserted into the buried dielectric layer. FIGS. 10(a) and 10(b) show a distribution of equipotential lines between two devices in two cases that the vertical field plate electrode is inserted into the buried dielectric layer or not. It is found that the equipotential lines are limited deep into the buried dielectric layer when the electrodes are inserted into the buried dielectric layer. FIGS. 11(a) and 11(b) show the distribution of the electric field drawing a line along a drain longitudinal direction. At the drain electrode, it can also be clearly found that a peak value of the electric field in the buried dielectric layer is obviously higher when the electrode is inserted into the buried dielectric layer, which is three times that of the device when the electrode is not inserted into the buried dielectric layer. Therefore, the device with the electrode being inserted into the buried dielectric layer can achieve ENDIF effect.

Embodiment 1

Figure 1:
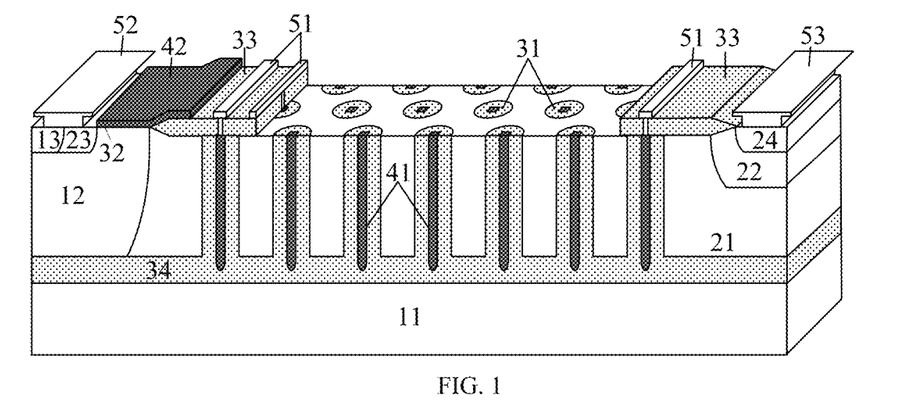
FIG. 1 is a schematic structural diagram of an SOI lateral homogenization field high voltage power semiconductor device according to Embodiment 1.

An SOI lateral homogenization field high voltage power semiconductor device described in Embodiment 1, as shown in FIG. 1, specifically comprises:

A type I conductive semiconductor substrate 11, a type I conductive well region 12, a type I conductive source heavily doped region 13, a type II conductive drift region 21, a type II conductive well region 22, a type II conductive source heavily doped region 23, a type II conductive drain heavily doped region 24, the first dielectric oxide layer 31, second dielectric oxide layer 32, third dielectric oxide layer 33, the buried dielectric layer 34, the polysilicon electrodes 41, a control gate polysilicon electrode 42, a source metal 52, and a drain metal 53;

Wherein the buried dielectric layer 34 is located above the type I conductive semiconductor substrate 11, the type II conductive drift region 21 is above the buried dielectric layer 34, the type I conductive well region 12 is located on the left side of the type II conductive drift region 21, the type I conductive source heavily doped region 13 and the type II conductive source heavily doped region 23 are located in the type I conductive well region 12, the type II conductive well region 22 is located on the right side of the type II conductive drift region 21, and the type II conductive drain heavily doped region 24 is located in the type II conductive well region 22; the second dielectric oxide layer 32 is located above the type I conductive well region 12, and a left end of the second dielectric oxide layer 32 is in contact with the type II conductive source heavily doped region 23, and the right end of the second dielectric oxide layer 32 is in contact with the type II conductive drift region 21; the third dielectric oxide layer 33 is located on the upper surface of the type II conductive drift region 21 between the second dielectric oxide layer 32 and the type II conductive drain heavily doped region 24; the control gate polysilicon electrode 42 covers the upper surface of the second dielectric oxide layer 32 and partially extends to the upper surface of the third dielectric oxide layer 33;

The first dielectric oxide layer 31 and the polysilicon electrode 41 constitute vertical floating field plates extending longitudinally, and the number of the vertical floating field plates is one or more; adjacent vertical floating field plates in source-drain directions are staggered; the vertical floating field plates are periodically distributed in entire of the type II conductive drift region 21, forming a voltage-sustaining layer having a plurality of equipotential floating trenches, and the equipotential floating trenches are connected with the buried dielectric layer 34. The poly-silicon electrode 41 is inserted into the buried dielectric layer 34, but does not penetrate the buried dielectric layer 34; and a longitudinal spacing and a transverse spacing of the adjacent vertical floating field plates are equal. The transverse direction is the source-drain direction, and the longitudinal direction is perpendicular to the source-drain direction.

The cross-sectional shape of trenches are rectangular, circular, oval, or hexagonal.

The device can also be an IGBT or PMOS device.

The thickness of the buried dielectric layer 34 is determined according to a desired voltage-sustaining level.

The basic working principle of this embodiment is as follows: in the case of the type I conductive semiconductor material being P-type, under the condition that no gate voltage is applied, the PN junction composed of the type II conductive drift region 21 and the type I conductive well region 12 starts depletion under and effect of a reverse voltage $V_d$, while the PN junction composed of the type I conductive semiconductor substrate 11 and the type II conductive drift region 21 also starts depletion under a drain voltage. At the same time, the floating electrode in the vertical field plate has an auxiliary depletion effect on the drift region, which makes the surface electric field distribute evenly, and the breakdown voltage is mostly sustained by the dielectric layer. Because the dielectric constant of silicon dioxide is less than that of silicon, the dielectric layer can sustaining most of the applied drain voltage, and thus the breakdown voltage of the device is improved. When a gate bias voltage $V_g$ is greater than the threshold voltage, inversion layer electrons appear in the surface of the type I conductive well region 12 near the second dielectric oxide layer 32, thereby making the source-drain conductive. Due to the existence of the vertical field plate structure, the extraction of inversion layer charge by transverse electric field is slowed down, and the inversion layer charge is bound in the trenches, which enhances the electric field of buried dielectric layer and improves the withstand voltage of the device. At the same time, due to the auxiliary depletion effect of the MIS structure, the concentration of the drift region can still be very high under a relatively thick drift region, which solves the problems that the depletion of the SOI substrate is insufficient and the concentration of the drift region is light. To sum up, the homogenization field device with a field clamped layer provided by the present invention has a higher breakdown voltage and a lower specific on-resistance than conventional devices.

Figure 7:
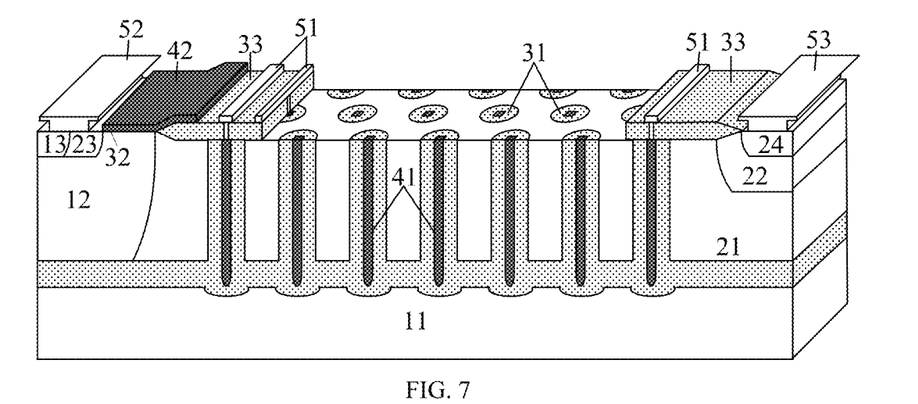
FIG. 7 is a schematic structural diagram of an SOI lateral homogenization field high voltage power semiconductor device according to Embodiment 7.

FIG. 7 is an SOI homogenization field high voltage power semiconductor device and a manufacturing method thereof, comprising the following steps:
  Step 1: selecting an SOI epitaxial wafer;
  Step 2: obtaining a type II conductive drift region 21 by implantation and diffusing on the SOI epitaxial wafer;
  Step 3: forming trenches by etching through the buried dielectric layer;
  Step 4, forming the first dielectric oxide layer the a trench wall, depositing polysilicon and etching to the silicon plane;
  Step 5: forming a type II conductive well region 22 by high energy ion implantation of type II conductive impurities and diffusing;

Step 6, forming the second dielectric oxide layer 32 by thermally oxidizing, and forming the third dielectric oxide layer 33 by depositing and etching;

Step 7, forming a type I conductive well region 12 by ion implantation of type I conductive impurities and diffusing;

Step 8: forming a control gate polysilicon electrode 42 by depositing polysilicon and etching;

Step 9: forming a type I conductive source heavily doped region 13, a type II conductive source heavily doped region 23 and a type II conductive drain heavily doped region 24 by implantation, activation and heavily doping.

This process is also suitable for the homogenization devices based on SiC and GaN and other wide band gap semiconductors.

Preferably, all of the dielectric oxide layers are formed by thermal growth or by deposition and etching.

Preferably, obtaining the type II conductive drift region 21 formed by implantation and diffusing in step 2 by epitaxy; and/or forming the type I conductive well region 12 and the type II conductive well region 22 obtained by implantation and diffusing in step 6 by multiple implantations and activation with different energies.

Embodiment 2

Figure 2:
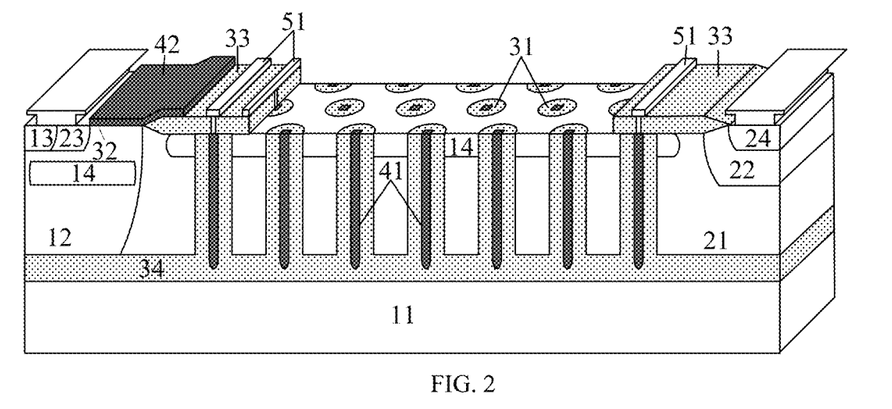
FIG. 2 is a schematic structural diagram of an SOI lateral homogenization field high voltage power semiconductor device according to Embodiment 2.

As shown in FIG. 2, it is a schematic structural diagram of an SOI lateral homogenization field high voltage power semiconductor device of Embodiment 2. The structure of this embodiment is different from that of Embodiment 1 in that a field clamped layer 14, i.e., a Ptop layer, is introduced in the surface of type II conductive drift region 21. The introduction of the Ptop layer brings about double charge self-balance, and MIS electrode assists P-type impurities in depletion at high potential and N-type impurities in depletion at low potential. At the same time, the P-type impurities and the N-type impurities can deplete each other, so the concentration of the drift region can be greatly increased, thereby reducing the specific on-resistance. Meanwhile, the Ptop layer ensures the continuity of the depletion and has the function of clamping the surface electric field, which makes the breakdown voltage maintain high at a wide drift region concentration range so that the device has high process tolerance. Technically, the same mask is adopted as type I conductive well region, which is formed by high-energy implantation with the blocking effect of the field oxide layer, and no additional mask is needed. The Ptop layer is not implanted at terminals to ensure that no additional PN junction is introduced, which leads to early breakdown of the source. Ptop and Pwell are connected together in the transition region to prevent early breakdown due to excessive drift region concentration. Its working principle is the same as that of Embodiment 1.

Embodiment 3

Figure 3:
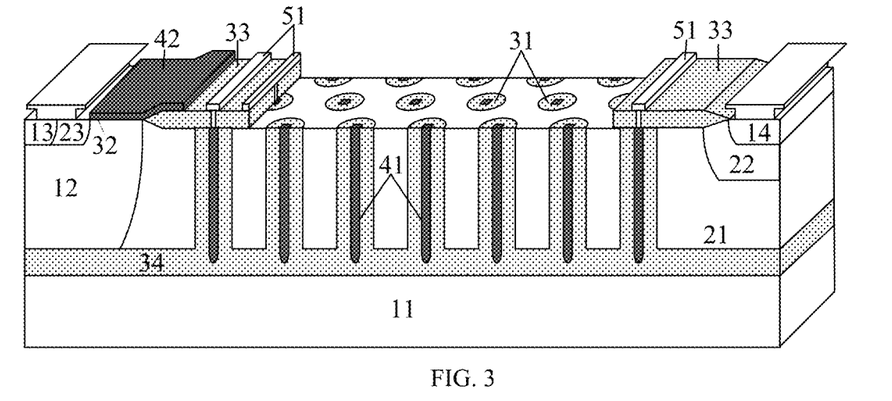
FIG. 3 is a schematic structural diagram of an SOI lateral homogenization field high voltage power semiconductor device according to Embodiment 3.

As shown in FIG. 3, it is a schematic structural diagram of an SOI lateral homogenization field high voltage power semiconductor device of Embodiment 3. The structure of this embodiment is different from that of Embodiment 1 in that the device is changed into an LIGBT device. Because the vertical field plate can assist depletion in both on and off states, the structure can greatly reduce the specific on-resistance.

Embodiment 4

Figure 4:
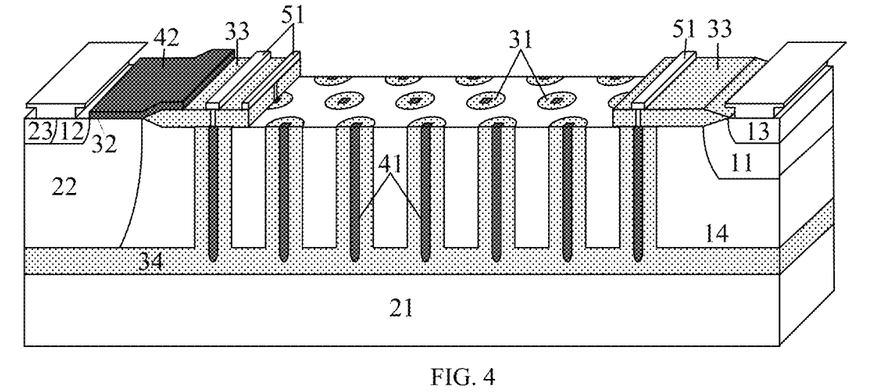
FIG. 4 is a schematic structural diagram of an SOI lateral homogenization field high voltage power semiconductor device according to Embodiment 4.

As shown in FIG. 4, it is a schematic structural diagram of an SOI lateral homogenization field high voltage power semiconductor device of Embodiment 4. The structure of this embodiment is different from that of Embodiment 1 in that the device is changed into a PLDMOS device. Because the PLDMOS device has no RESURF effect, its application range is limited. Because the vertical field plate can assist both depletion of the N-type impurities and P-type impurities, the concentration of a P epitaxial layer can be made very high, and the application range is improved.

Embodiment 5

Figure 5:
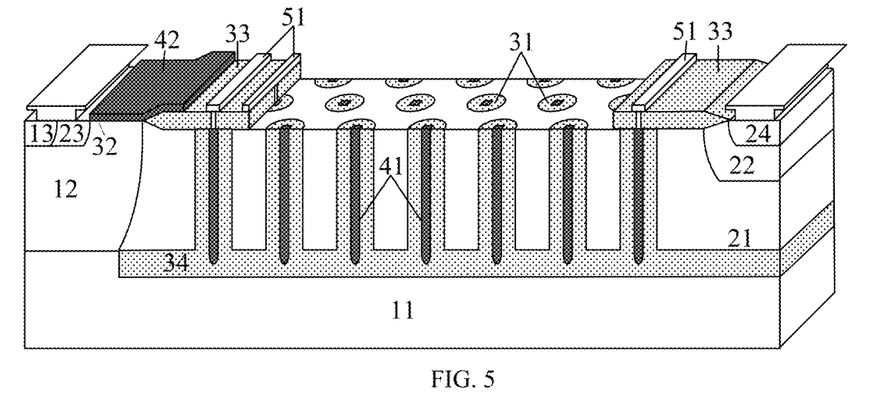
FIG. 5 is a schematic structural diagram of an SOI lateral homogenization field high voltage power semiconductor device according to Embodiment 5.

As shown in FIG. 5, it is a schematic structural diagram of an SOI lateral homogenization field high voltage power semiconductor device of Embodiment 5. The structure of this embodiment is different from that of Embodiment 1 in that a part of the buried dielectric layer below the source is removed, so that heat dissipation can be increased while maintaining the original electric characteristics. Its working principle is the same as that of Embodiment 1.

Embodiment 6

Figure 6:
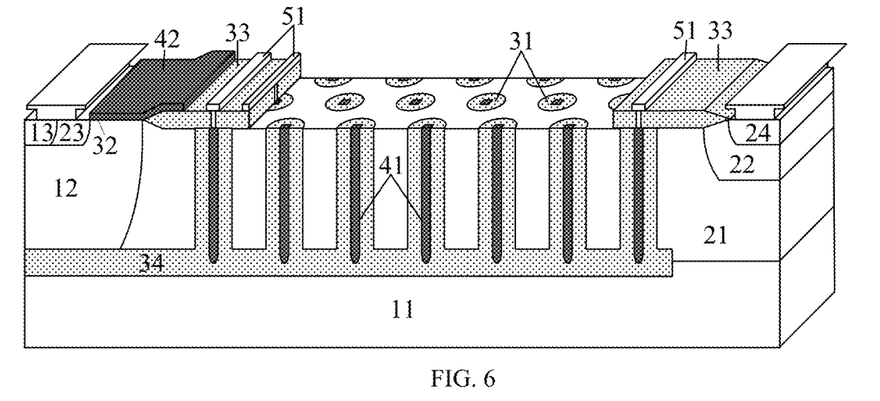
FIG. 6 is a schematic structural diagram of an SOI lateral homogenization field high voltage power semiconductor device according to Embodiment 6.

As shown in FIG. 6, it is a schematic structural diagram of an SOI lateral homogenization field high voltage power semiconductor device of Embodiment 6. The structure of this embodiment is different from that of Embodiment 1 in that a part of the buried dielectric layer below the drain is removed, so that substrate can also participate in a part of voltage-sustaining, which integrates the characteristics of bulk silicon and SOI and reduces the self-heating effect of the device. Its working principle is the same as that of Embodiment 1.

Embodiment 7

As shown in FIG. 7, it is a schematic structural diagram of an SOI lateral homogenization field high voltage power semiconductor device of Embodiment 7. The structure of this embodiment is different from that of Embodiment 1 in that in step 3 of the process, the trench is dug through the buried dielectric layer to reach a substrate, and the substrate is assisted by depletion using a vertical field plate. Its working principle is the same as that of Embodiment 1.

Embodiment 8

Figure 8:
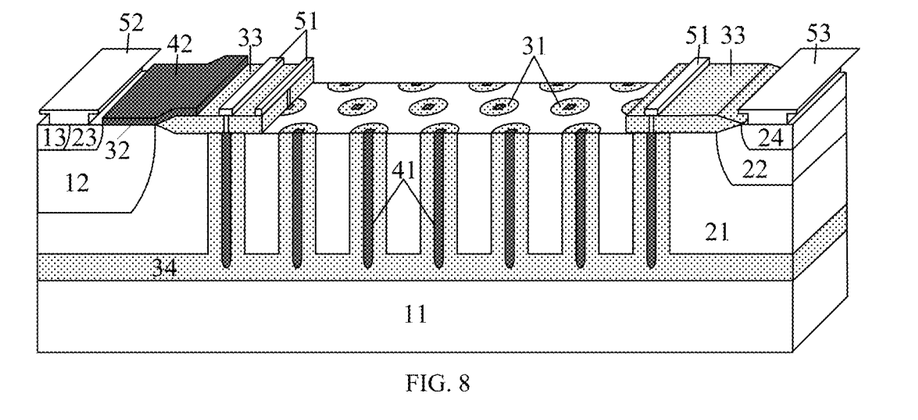
FIG. 8 is a schematic structural diagram of an SOI lateral homogenization field high voltage power semiconductor device according to Embodiment 8.
Figure 9A:
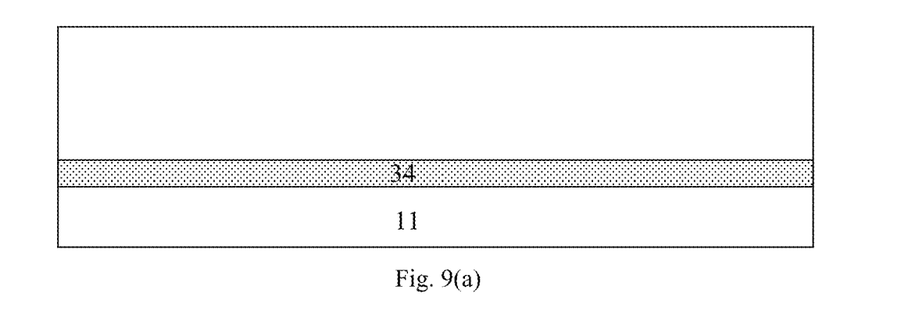
Figure 9B:
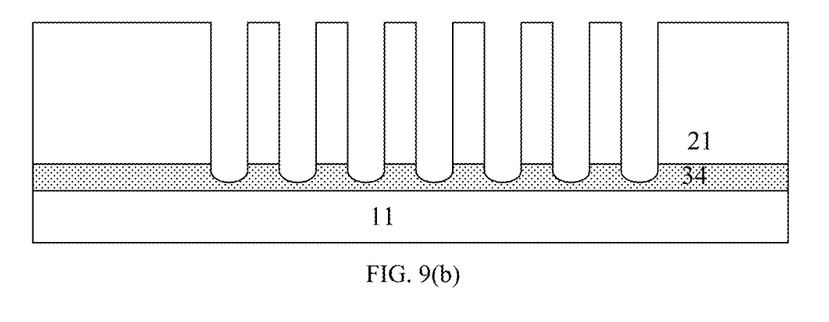
Figure 9C:
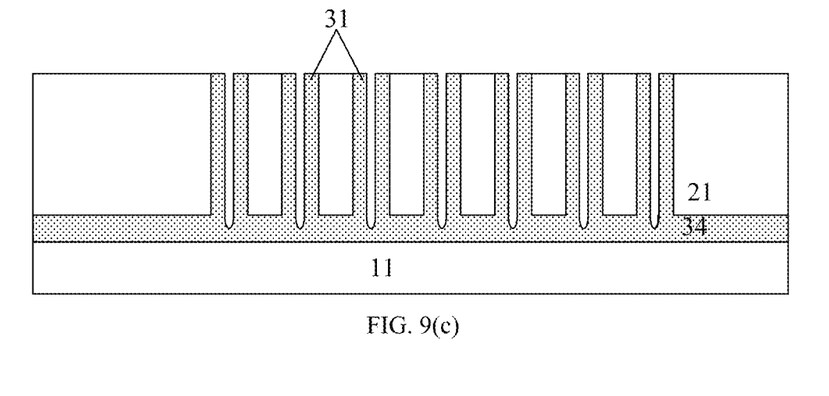
Figure 9D:
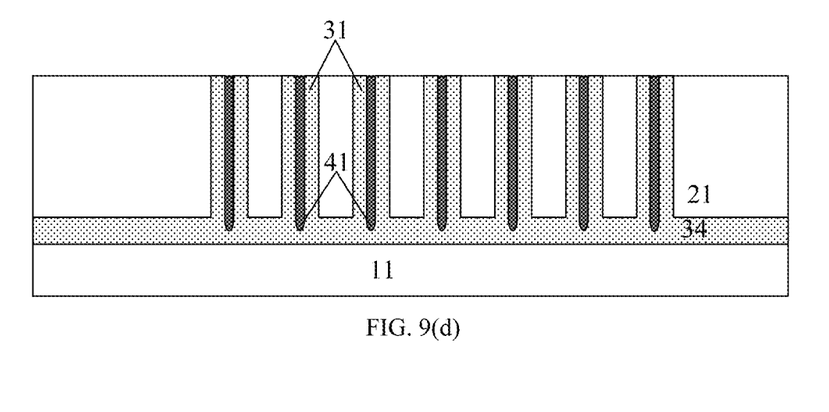
Figure 9E:
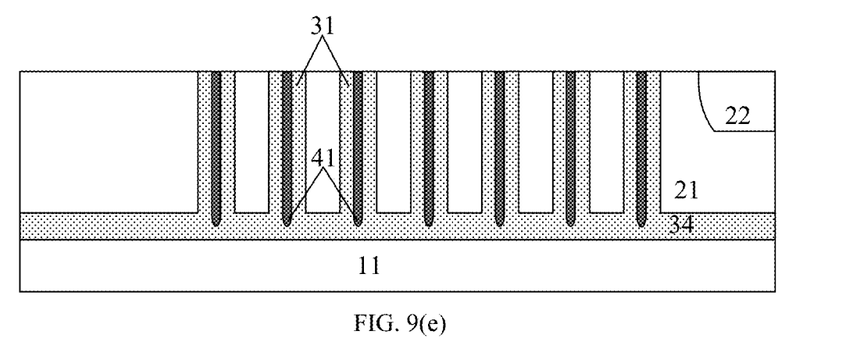
Figure 9F:
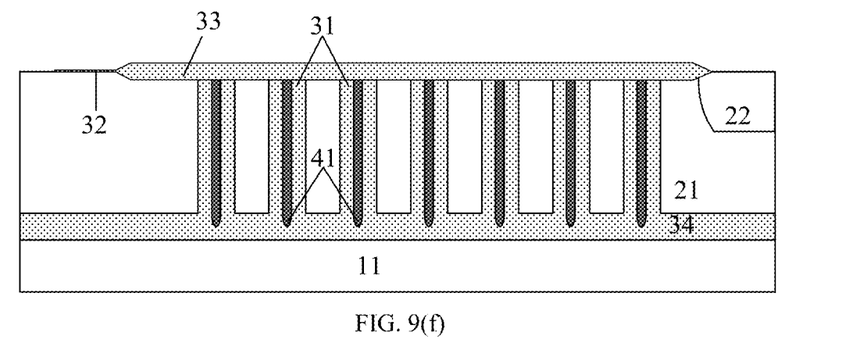
Figure 9G:
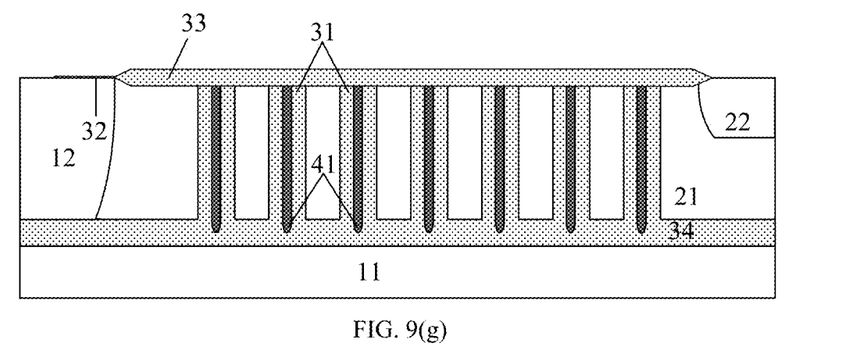
Figure 9H:
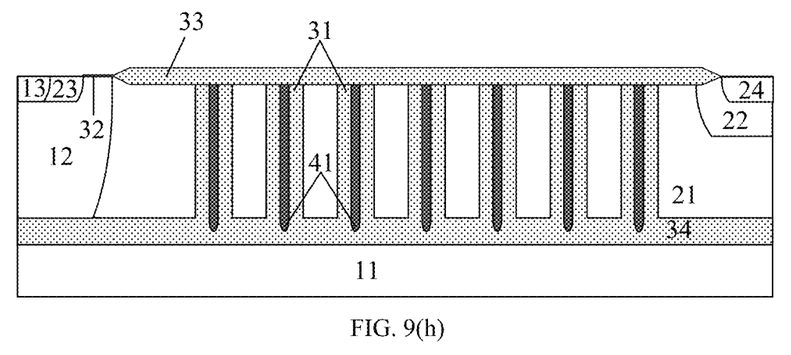
Figure 9I:
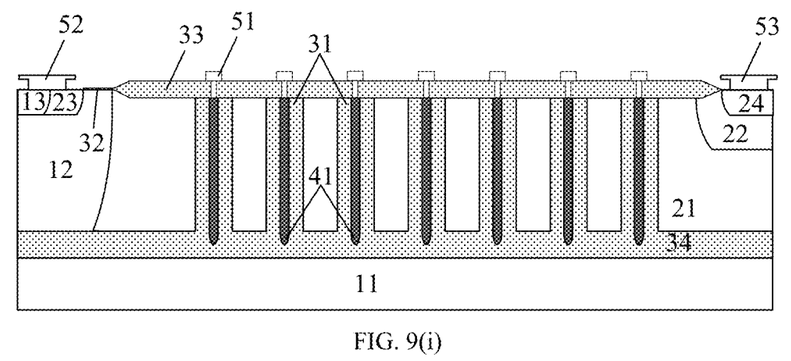

As shown in FIG. 8, it is a schematic structural diagram of an SOI lateral homogenization field high voltage power semiconductor device of Embodiment 8. The structure of this embodiment is different from that of Embodiment 1 in that in step 2, the type II conductive drift region 21 adopts a thermal drive-in process, and concentration distribution of the type II conductive drift region 21 is a complementary error distribution, which can make a thick epitaxial layer and is more suitable for high voltage devices. Its working principle is the same as that of Embodiment 1.

What is claimed is:
1. A silicon-on-insulator (SOI) lateral homogenization field high voltage power semiconductor device, comprising a type I conductive semiconductor substrate, a type I conductive well region, a type I conductive source heavily doped region, a type II conductive drift region, a type II conductive well region, a type II conductive source heavily doped region, a type II conductive drain heavily doped region, a first dielectric oxide layer, a second dielectric oxide layer, a third dielectric oxide layer; a buried dielectric layer, polysilicon electrodes, a control gate polysilicon electrode, a source metal, and a drain metal;

wherein the buried dielectric layer is located above the type I conductive semiconductor substrate, the type II conductive drift region is above the buried dielectric layer, the type I conductive well region is located on a left side of the type II conductive drift region, the type I conductive source heavily doped region and the type II conductive source heavily doped region are located in the type I conductive well region, the type II conductive well region is located on a right side of the type II conductive drift region, and the type II conductive drain heavily doped region is located in the type II conductive well region; the second dielectric oxide layer is located above the type I conductive well region, wherein a left end of the second dielectric oxide layer is in contact with the type II conductive source heavily doped region, and a right end of the second dielectric oxide layer is in contact with the type II conductive drift region; the third dielectric oxide layer is located on an upper surface of the type II conductive drift region between the second dielectric oxide layer and the type II conductive drain heavily doped region; the control gate polysilicon electrode covers an upper surface of the second dielectric oxide layer and partially extends to an upper surface of the third dielectric oxide layer; and the first dielectric oxide layer and the polysilicon electrodes constitute vertical floating field plates extending longitudinally, and a number of the vertical floating field plates is one or more; adjacent vertical floating field plates in source-drain directions are staggered; the vertical floating field plates are periodically distributed in the entire type II conductive drift region, forming a voltage-sustaining layer having a plurality of equipotential floating trenches; the plurality of equipotential floating trenches are connected with the buried dielectric layer, and the polysilicon electrodes are inserted into the buried dielectric layer, but do not penetrate the buried dielectric layer; a longitudinal spacing and a transverse spacing of the adjacent vertical floating field plates are equal; a transverse direction is the source-drain direction, and a longitudinal direction is perpendicular to the source-drain direction.

2. The SOI lateral homogenization field high voltage power semiconductor device according to claim 1, wherein a cross-sectional shape of the discrete trenches is rectangular, circular, oval, or hexagonal.

3. The SOI lateral homogenization field high voltage power semiconductor device according to claim 1, wherein a field clamped layer is introduced in a surface of the type II conductive drift region, wherein the field clamped layer is a Ptop layer.

4. The SOI lateral homogenization field high voltage power semiconductor device according to claim 1, wherein the device is changed to a lateral insulated-gate bipolar transistor (LIGBT) device or a lateral double-diffused metal-oxide semiconductor (PLDMOS) device.

5. The SOI lateral homogenization field high voltage power semiconductor device according to claim 1, wherein a part of the buried dielectric layer below a source is removed; or/and a part of the buried dielectric layer below a drain is removed.

6. A manufacturing method of the SOI lateral homogenization field high voltage power semiconductor device according to claim 1, comprising:

step 1: selecting an SOI epitaxial wafer;

step 2: obtaining the type II conductive drift region by implantation and diffusing on the SOI epitaxial wafer;

step 3: forming the trenches by etching through the buried dielectric layer;

step 4, forming the first dielectric oxide layer on a trench wall, depositing polysilicon and etching to the silicon plane;

step 5: forming the type II conductive well region by ion implantation of type II conductive impurities and diffusing;

step 6, forming the second dielectric oxide layer by thermally oxidizing, and forming the third dielectric oxide layer by depositing and etching;

step 7, forming the type I conductive well region by ion implantation of type I conductive impurities and diffusing;

step 8: forming the control gate polysilicon electrode by depositing the polysilicon and etching; and step 9: forming the type I conductive source heavily doped region, the type II conductive source heavily doped region and the type II conductive drain heavily doped region by implantation and activation.

7. The manufacturing method of the SOI lateral homogenization field high voltage power semiconductor device according to claim 6, wherein obtaining the type II conductive drift region formed by implantation and diffusing in step 2 by epitaxy; and/or forming the type I conductive well region and the type II conductive well region obtained by implantation and diffusing in step 6 by multiple implantations and activation with different energies.

8. The manufacturing method of the SOI lateral homogenization field high voltage power semiconductor device according to claim 6, wherein in step 3 of the process, the trench is dug through the buried dielectric layer to reach a substrate, and the substrate is auxiliary depleted by the vertical field plate.

9. The manufacturing method of the SOI lateral homogenization field high voltage power semiconductor device according to claim 6, wherein in step 2, the type II conductive drift region adopts a thermal drive-in process, and concentration distribution of the type II conductive drift region is a complementary error distribution.

10. The manufacturing method of the SOI lateral homogenization field high voltage power semiconductor device according to claim 6, wherein the manufacturing method is applied for SiC,GaN and other wide band gap semiconductors.

11. The manufacturing method of the SOI lateral homogenization field high voltage power semiconductor device according to claim 6, wherein a cross-sectional shape of the discrete trenches are rectangular, circular, oval, or hexagonal.

12. The manufacturing method of the SOI lateral homogenization field high voltage power semiconductor device according to claim 6, wherein a field clamped layer is introduced in a surface of the type II conductive drift region, wherein the field clamped layer is a Ptop layer.

13. The manufacturing method of the SOI lateral homogenization field high voltage power semiconductor device according to claim 6, wherein the device is changed to an LIGBT device or a PLDMOS device.

14. The manufacturing method of the SOI lateral homogenization field high voltage power semiconductor device according to claim 6, wherein a part of the buried dielectric layer below a source is removed; or/and a part of the buried dielectric layer below a drain is removed.

15. The manufacturing method of the SOI lateral homogenization field high voltage power semiconductor device according, to claim 7, wherein the manufacturing method is applied for SiC,GaN and other wide band gap semiconductors.

16. The manufacturing method of the SOI lateral homogenization field high voltage power semiconductor device according to claim 8, wherein the manufacturing method is applied for SiC,GaN and other wide band gap semiconductors.

17. The manufacturing method of the SOI lateral homogenization field high voltage power semiconductor device according to claim 9, wherein the manufacturing method is applied for SiC,GaN and other wide band gap semiconductors.

\* \* \* \* \*